United States Patent
Dang et al.

(10) Patent No.: US 12,439,725 B2
(45) Date of Patent: Oct. 7, 2025

(54) SOLAR CELL, SOLAR CELL MODULE, AND METHOD FOR MANUFACTURING SOLAR CELL

(71) Applicant: LONGI SOLAR TECHNOLOGY (XI'AN) CO., LTD., Xi'an (CN)

(72) Inventors: Zhangwei Dang, Xi'an (CN); Minghua Bai, Xi'an (CN); Hui Li, Xi'an (CN); Huijun Zhu, Xi'an (CN); Feilin Ping, Xi'an (CN)

(73) Assignee: LONGI SOLAR TECHNOLOGY(XI'AN) CO., LTD., Xi'an (CN)

( * ) Notice: Subject to any disclaimer, the term of this patent is extended or adjusted under 35 U.S.C. 154(b) by 0 days.

(21) Appl. No.: 19/081,291

(22) Filed: Mar. 17, 2025

(65) Prior Publication Data

US 2025/0221086 A1  Jul. 3, 2025

Related U.S. Application Data (63) Continuation of application No. PCT/CN2024/122489, filed on Sep. 29, 2024.

(30) Foreign Application Priority Data

Oct. 18, 2023 (CN) .......................... 202311355729.6

(51) Int. Cl.
  *H10F 77/162* (2025.01)
  *H10F 19/90* (2025.01)
  (Continued)

(52) U.S. Cl.
  CPC ......... *H10F 77/162* (2025.01); *H10F 19/902* (2025.01); *H10F 71/128* (2025.01);
  (Continued)

(58) Field of Classification Search
  None
  See application file for complete search history.

(56) References Cited

U.S. PATENT DOCUMENTS

2007/0256728 A1* 11/2007 Cousins ................ H10F 77/935
    136/252
2013/0153026 A1* 6/2013 Ooiwa ................ H10D 62/117
    257/618

(Continued)

FOREIGN PATENT DOCUMENTS

CN  105655427 A  6/2016
CN  109037359 A  12/2018

(Continued)

OTHER PUBLICATIONS

English language machine translation of KR-20150007396-A. (Year: 2025).*

(Continued)

*Primary Examiner* — Eli S Mekhlin
(74) *Attorney, Agent, or Firm* — Fish & Richardson P.C.

(57) ABSTRACT

The present application discloses a solar cell, a solar cell module, and a method for manufacturing a solar cell. In one example, a solar cell includes a semiconductor substrate, an ultra-thin dielectric layer, a passivation layer, a first electrode, and metallic crystals. The semiconductor substrate has a light receiving surface and a back surface opposite to the light receiving surface. The ultra-thin dielectric layer is formed on at least one of the back surface and the light receiving surface of the semiconductor substrate. The passivation layer is formed on the ultra-thin dielectric layer. The first electrode is formed on the passivation layer. The metallic crystals are formed in the passivation layer. The metallic crystals include a first metallic crystal, where an end surface of the first metallic crystal abuts against the ultra- (Continued)

thin dielectric layer, and another end surface of the first metallic crystal is connected to the first electrode.

17 Claims, 2 Drawing Sheets

(51) Int. Cl.
*H10F 71/00* (2025.01)
*H10F 77/30* (2025.01)

(52) U.S. Cl.
CPC ......... *H10F 71/129* (2025.01); *H10F 71/134* (2025.01); *H10F 77/311* (2025.01); *H10F 77/315* (2025.01)

(56) References Cited

U.S. PATENT DOCUMENTS

| | | | | |
|---|---|---|---|---|
| 2013/0340822 | A1* | 12/2013 | Nam | H10F 77/211 |
| | | | | 136/256 |
| 2017/0069767 | A1* | 3/2017 | Kim | H10F 77/315 |
| 2019/0326456 | A1* | 10/2019 | Ha | H10F 77/211 |

FOREIGN PATENT DOCUMENTS

| | | | | |
|---|---|---|---|---|
| CN | 112331742 | A | | 2/2021 |
| CN | 115732585 | A | | 3/2023 |
| CN | 116314471 | A | | 6/2023 |
| CN | 116469945 | A | | 7/2023 |
| CN | 116504858 | A | | 7/2023 |
| CN | 116759465 | A | | 9/2023 |
| FR | 2964252 | A1 | * | 3/2012 ..... H01L 31/022425 |
| KR | 20150007396 | A | * | 1/2015 ........... H10F 71/121 |

OTHER PUBLICATIONS

English language machine translation of FR-2964252-A1. (Year: 2025).*
International Search Report and Written Opinion in International Appln. No. PCT/CN2024/122489, mailed on Nov. 27, 2024, 13 pages (with English translation).
Office Action and Search Report in Chinese Appln. No. 202311355729.6, dated Apr. 28, 2024, 25 pages (with English translation).
Office Action in Australian Appln. No. 2024329874, dated Apr. 9, 2025, 5 pages.
Office Action in Chinese Appln. No. 202311355729.6, dated Jun. 28, 2024, 18 pages (with English translation).
Office Action in Chinese Appln. No. 202311355729.6, dated Oct. 31, 2024, 21 pages (with machine translation).

* cited by examiner

SOLAR CELL, SOLAR CELL MODULE, AND METHOD FOR MANUFACTURING SOLAR CELL

CROSS-REFERENCE TO RELATED APPLICATIONS

The present application is a continuation application of PCT application No. PCT/CN2024/122489, filed on Sep. 29, 2024, which claims priority to Chinese Patent Application No. 202311355729.6 filed on Oct. 18, 2023. The disclosures of the aforementioned applications are hereby incorporated by reference in their entireties.

TECHNICAL FIELD

The present application relates to the technical field of solar cells, and in particular, to a solar cell, a solar cell module, and a method for manufacturing a solar cell.

BACKGROUND

A solar cell is a device utilizing solar energy, which directly converts light energy into electric energy through the photoelectric effect or the photochemical effect. The solar cell includes a tunnel oxide passivated contact solar cell (TOPCon).

A thick polycrystalline silicon layer is deposited at a doped passivation layer of the TOPCon cell, leading to long time required for carriers to pass through the passivation layer and severe light parasitic absorption, and affecting the cell efficiency of the TOPCon cell.

SUMMARY

An objective of the present application is to provide a solar cell, a solar cell module, and a method for manufacturing a solar cell, to improve carrier transmission efficiency and reduce light parasitic absorption, thereby ensuring the cell efficiency of a TOPCon cell.

To achieve the foregoing objective, according to a first aspect, the present application provides a solar cell. The solar cell includes: a semiconductor substrate, an ultra-thin dielectric layer, a passivation layer (which is also referred to as a doped semiconductor layer in the art), a first electrode, and metallic crystals. The semiconductor substrate has a light receiving surface and a back surface opposite to the light receiving surface, the ultra-thin dielectric layer is formed on at least one of the back surface and the light receiving surface of the semiconductor substrate, the passivation layer is formed on the ultra-thin dielectric layer, the first electrode is formed on the passivation layer, and the metallic crystals are formed in the passivation layer. The metallic crystals include a first metallic crystal, where an end surface of the first metallic crystal abuts against the ultra-thin dielectric layer, and another end surface of the first metallic crystal is connected to the first electrode.

Compared with the related art, in the solar cell provided in the present application, on the basis of not thinning the passivation layer, the carrier transmission efficiency can be improved, an open circuit voltage loss can be reduced or eliminated, and excellent electrical contact performance between electrodes and the passivation layer can be ensured. Further, an end surface of the first metallic crystal abuts against the ultra-thin dielectric layer, and another end surface of the first metallic crystal is connected to the first electrode, to form a structure of metal-ultra-thin dielectric layer-semiconductor. In addition, the first metallic crystal is located in the passivation layer, so that the first metallic crystal is in full contact with the passivation layer. Based on this, a fill factor can be optimized by controlling a ratio of the first metallic crystal, thereby balancing an open circuit voltage and the fill factor. Furthermore, under an action of the first metallic crystal, movement of carriers to the first electrode is facilitated, a carrier transmission rate is accelerated, and time required for the carriers to pass through the passivation layer is further shortened. In addition, the first metallic crystal does not pass through the ultra-thin dielectric layer and enter the semiconductor substrate. In this case, it can be ensured that the ultra-thin dielectric layer is not damaged, thereby prevent functions of the ultra-thin dielectric layer from being affected. That is, good chemical passivation and tunneling effects of the ultra-thin dielectric layer are ensured. In addition, influence on the open circuit voltage can be further reduced, to prevent the semiconductor substrate from being damaged and prevent functions of the semiconductor substrate from being affected, thereby ensuring the performance of the solar cell.

In conclusion, the first metallic crystal abuts against the ultra-thin dielectric layer without damaging a structure of the ultra-thin dielectric layer, so that good chemical passivation and tunneling effects of the ultra-thin dielectric layer are ensured. As a tunneling transmission layer of major carriers, the ultra-thin dielectric layer can transmit major carriers in the semiconductor substrate to pass through the ultra-thin dielectric layer. Next, the first metallic crystal plays a role in quickly transmitting major carriers passing through the ultra-thin dielectric layer to the first electrode, to ensure that a higher fill factor is obtained, and the transmission efficiency of major carriers in a good passivation structure can bring small contact resistivity and series resistance, thereby ensuring that higher cell efficiency is obtained.

In an embodiment, the passivation layer is partially arranged on at least one of the back surface and the light receiving surface.

In an embodiment, a ratio of a quantity of the first metallic crystal to a total quantity of the metallic crystals is greater than or equal to 2% and less than or equal to 20%.

In a case that the foregoing technical solution is used, a tunneling-polycrystalline carrier tunneling effect can be prevented from being affected by an excessive quantity of the first metallic crystal.

In an embodiment, a width of the first metallic crystal gradually decreases along a direction from the first electrode to the passivation layer.

In a case that the foregoing technical solution is used, the width of the first metallic crystal gradually decreases along the direction from the first electrode to the passivation layer, thereby reducing corrosion to the passivation layer and the semiconductor substrate, and reducing metal recombination between metal-ultra-thin dielectric layer interfaces. Further, the width of the first metallic crystal gradually increases along a direction from the passivation layer to the first electrode, so that a contact area between the first metallic crystal and the first electrode is increased, which is conducive to improving the transmission efficiency of major carriers transmitted by the first metallic crystal to the first electrode.

In an embodiment, the metallic crystals further include a second metallic crystal. The second metallic crystal is connected to the first electrode and is spaced apart from the first metallic crystal. A thickness of the second metallic crystal is less than a thickness of the passivation layer, and a thickness direction of the second metallic crystal and a thickness direction of the passivation layer are consistent with a direction from the back surface to the light receiving surface.

In a case that the foregoing technical solution is used, movement of the carriers to the first electrode is further facilitated, the carrier transmission rate is further accelerated, and time required for the carriers to pass through the passivation layer is further shortened, thereby ensuring the cell efficiency of the TOPCon cell. In addition, contact resistance between the first electrode and the passivation layer can be further reduced. Further, since the thickness of the second metallic crystal is less than the thickness of the passivation layer, the second metallic crystal can be prevented from damaging the ultra-thin dielectric layer and the semiconductor substrate, thereby ensuring the performance of the solar cell.

In an embodiment, the second metallic crystal includes a plurality of second metallic crystals distributed at intervals; and/or a ratio of a quantity of the plurality of second metallic crystals to a total quantity of the metallic crystals is greater than or equal to 50% and less than or equal to 90%.

In an embodiment, the metallic crystals further include a third metallic crystal. The third metallic crystal is spaced apart from the first electrode, the ultra-thin dielectric layer, and the second metallic crystal.

In an embodiment, the third metallic crystal includes a plurality of third metallic crystals separately distributed in the passivation layer; and/or along a direction from the first electrode to the passivation layer, a distance between the plurality of third metallic crystals and the first electrode is less than a distance between the plurality of third metallic crystals and the ultra-thin dielectric layer; and/or a ratio of a quantity of the second metallic crystal to a total quantity of the metallic crystals is less than or equal to 5%; and/or a ratio of an average volume of the plurality of third metallic crystals to an average volume of the second metallic crystal is less than or equal to 10%.

In a case that the foregoing technical solution is used, a third metallic crystal with a small size is easily separated from the first electrode, and in an actual manufacturing process, the third metallic crystal is not expected to appear but inevitably appears during manufacturing. Therefore, the average volume and the quantity of the plurality of third metallic crystals need to be controlled to fall within the foregoing value ranges, to reduce influence generated by the third metallic crystal on the efficiency of the solar cell.

In an embodiment, when the passivation layer is a doped passivation layer, the doped passivation layer includes: a first heavily doped region and a first lightly doped region. The first heavily doped region is correspondingly connected to the first electrode. The first lightly doped region is formed on a side of the first heavily doped region, and a doping concentration of the first heavily doped region is greater than a doping concentration of the first lightly doped region.

In a case that the foregoing technical solution is used, the first heavily doped region is correspondingly connected to the first electrode, so that good ohmic contact between the first electrode and the doped passivation layer can be ensured, thereby improving a fill factor. Further, the first lightly doped region is not in contact with the first electrode, so that a non-metal contact region is formed, and the doping concentration of the first lightly doped region is low. Therefore, this is conducive to reducing Auger recombination of the non-metal contact region and reducing parasitic absorption of the doped passivation layer to ultraviolet light. In addition, in the related art, to ensure good ohmic contact between the doped passivation layer and the first electrode, generally, a printing line width of a silver paste for forming the first electrode during screen printing is wide, leading to high unit consumption and high costs. However, in the present application, the first electrode is connected to the first heavily doped region, so that good ohmic contact between the first electrode and the doped passivation layer is ensured. Therefore, the printing line width of the silver paste for forming the first electrode may be appropriately narrowed to reduce manufacturing costs.

In an embodiment, a thickness of the doped passivation layer is greater than or equal to 50 nm and less than or equal to 200 nm.

In a case that the foregoing technical solution is used, compared with the related art, in the embodiments of the present application, in a case that the thickness of the doped passivation layer is not thinned, the carrier transmission efficiency can be improved, an open circuit voltage loss can be reduced or eliminated, and excellent electrical contact performance between electrodes and the passivation layer can be ensured.

In an embodiment, a thickness of the ultra-thin dielectric layer is greater than or equal to 1 nm and less than or equal to 2 nm. A thickness direction of the ultra-thin dielectric layer is consistent with a direction from the light receiving surface to the back surface; and/or a material of the ultra-thin dielectric layer includes one of silicon oxide, hafnium oxide, aluminum oxide, or silicon nitride.

According to a second aspect, the present application further provides a solar cell module, including two or more solar cells electrically connected in series, each of the two or more solar cells being the solar cell described above; and a conductive wire, where the conductive wire is configured to electrically connect the two or more solar cells in series, and a projection of the conductive wire on a plane in which the passivation layer is located partially overlaps with a projection of the first electrode on the plane in which the passivation layer is located.

According to a third aspect, the present application further provides a method for manufacturing a solar cell. The method for manufacturing a solar cell includes:

providing a semiconductor substrate, where the semiconductor substrate has a light receiving surface and a back surface opposite to the light receiving surface; forming an ultra-thin dielectric layer on at least one of the back surface and the light receiving surface of the semiconductor substrate; forming a passivation layer on the ultra-thin dielectric layer; forming a first electrode on the passivation layer; forming metallic crystals in the passivation layer, where the metallic crystals include a first metallic crystal, an end surface of the first metallic crystal abutting against the ultra-thin dielectric layer, and another end surface of the first metallic crystal being connected to the first electrode.

Compared with the related art, in the method for manufacturing a solar cell provided in the present application, on the basis of not thinning the passivation layer, the carrier transmission efficiency can be improved, an open circuit voltage loss can be reduced or eliminated, and excellent electrical contact performance between electrodes and the passivation layer can be ensured. Further, an end surface of the first metallic crystal abuts against the ultra-thin dielectric layer, and another end surface of the first metallic crystal is connected to the first electrode, to form a structure of metal-ultra-thin dielectric layer-semiconductor. In addition, the first metallic crystal is located in the passivation layer, so that the first metallic crystal is in full contact with the passivation layer. Based on this, a fill factor can be optimized by controlling a ratio of the first metallic crystal, thereby balancing an open circuit voltage and the fill factor. Furthermore, under an action of the first metallic crystal, movement of carriers to the first electrode is facilitated, a carrier transmission rate is accelerated, and time required for the carriers to pass through the passivation layer is further shortened. In addition, the first metallic crystal does not pass through the ultra-thin dielectric layer and enter the semiconductor substrate. In this case, it can be ensured that the ultra-thin dielectric layer is not damaged, thereby prevent functions of the ultra-thin dielectric layer from being affected. That is, good chemical passivation and tunneling effects of the ultra-thin dielectric layer are ensured. In addition, influence on the open circuit voltage can be further reduced, to prevent the semiconductor substrate from being damaged and prevent functions of the semiconductor substrate from being affected, thereby ensuring the performance of the solar cell.

In conclusion, the first metallic crystal abuts against the ultra-thin dielectric layer without damaging a structure of the ultra-thin dielectric layer, so that good chemical passivation and tunneling effects of the ultra-thin dielectric layer are ensured. As a tunneling transmission layer of major carriers, the ultra-thin dielectric layer can transmit major carriers in the semiconductor substrate to pass through the ultra-thin dielectric layer. Next, the first metallic crystal plays a role in quickly transmitting major carriers passing through the ultra-thin dielectric layer to the first electrode, to ensure that a higher fill factor is obtained, and the transmission efficiency of major carriers in a good passivation structure can bring small contact resistivity and series resistance, thereby ensuring that higher cell efficiency is obtained.

In an embodiment, a ratio of a quantity of the first metallic crystal to a total quantity of the metallic crystals is greater than or equal to 2% and less than or equal to 20%.

In a case that the foregoing technical solution is used, a tunneling-polycrystalline carrier tunneling effect can be prevented from being affected by an excessive quantity of the first metallic crystal.

In an embodiment, a width of the first metallic crystal gradually decreases along a direction from the first electrode to the passivation layer.

In a case that the foregoing technical solution is used, the width of the first metallic crystal gradually decreases along the direction from the first electrode to the passivation layer, thereby reducing corrosion to the passivation layer and the semiconductor substrate, and reducing metal recombination between metal-ultra-thin dielectric layer interfaces. Further, the width of the first metallic crystal gradually increases along a direction from the passivation layer to the first electrode, so that a contact area between the first metallic crystal and the first electrode is increased, which is conducive to improving the transmission efficiency of major carriers transmitted by the first metallic crystal to the first electrode.

In an embodiment, the metallic crystals further include a second metallic crystal. The second metallic crystal is connected to the first electrode and is spaced apart from the first metallic crystal. A thickness of the second metallic crystal is less than a thickness of the passivation layer, and a thickness direction of the second metallic crystal and a thickness direction of the passivation layer are consistent with a direction from the back surface to the light receiving surface.

In a case that the foregoing technical solution is used, movement of the carriers to the first electrode is further facilitated, the carrier transmission rate is further accelerated, and time required for the carriers to pass through the passivation layer is further shortened, thereby ensuring the cell efficiency of the TOPCon cell. In addition, contact resistance between the first electrode and the passivation layer can be further reduced. Further, since the thickness of the second metallic crystal is less than the thickness of the passivation layer, the second metallic crystal can be prevented from damaging the ultra-thin dielectric layer and the semiconductor substrate, thereby ensuring the performance of the solar cell.

In an embodiment, the second metallic crystal includes a plurality of second metallic crystals distributed at intervals; and/or a ratio of a quantity of the plurality of second metallic crystals to a total quantity of the metallic crystals is greater than or equal to 50% and less than or equal to 90%.

In an embodiment, the metallic crystals further include a third metallic crystal. The third metallic crystal is spaced apart from the first electrode, the ultra-thin dielectric layer, and the second metallic crystal.

In an embodiment, the third metallic crystal includes a plurality of third metallic crystals separately distributed in the passivation layer; and/or along a direction from the first electrode to the passivation layer, a distance between the plurality of third metallic crystals and the first electrode is less than a distance between the plurality of third metallic crystals and the ultra-thin dielectric layer; and/or a ratio of a quantity of the second metallic crystal to a total quantity of the metallic crystals is less than or equal to 5%; and/or a ratio of an average volume of the plurality of third metallic crystals to an average volume of the second metallic crystal is less than or equal to 10%.

In a case that the foregoing technical solution is used, a third metallic crystal with a small size is easily separated from the first electrode, and in an actual manufacturing process, the third metallic crystal is not expected to appear but inevitably appears during manufacturing. Therefore, the average volume and the quantity of the plurality of third metallic crystals need to be controlled to fall within the foregoing value ranges, to reduce influence generated by the third metallic crystal on the efficiency of the solar cell.

In an embodiment, after the forming a passivation layer on the ultra-thin dielectric layer, the method for manufacturing a solar cell further includes:
    performing doping diffusion treatment on the passivation layer to form a doped passivation layer;
    performing post-diffusion deposition treatment on the doped passivation layer, to form a second doping source layer on the doped passivation layer; and
    performing regional treatment on the second doping source layer by using a laser irradiation process, to form a first heavily doped region in the doped passivation layer, where a part of the doped passivation layer apart from the first heavily doped region is a first lightly doped region; and
    the first heavily doped region is correspondingly connected to the first electrode, a doping concentration of the first heavily doped region being greater than a doping concentration of the first lightly doped region.

In a case that the foregoing technical solution is used, the first heavily doped region is correspondingly connected to the first electrode, so that good ohmic contact between the first electrode and the doped passivation layer can be ensured, thereby improving a fill factor. Further, the first lightly doped region is not in contact with the first electrode, so that a non-metal contact region is formed, and the doping concentration of the first lightly doped region is low. Therefore, this is conducive to reducing Auger recombination of the non-metal contact region and reducing parasitic absorption of the doped passivation layer to ultraviolet light.

In an embodiment, a diffusion temperature in the doping diffusion treatment is greater than or equal to 800° C. and less than or equal to 830° C.; and a diffusion temperature in the post-diffusion deposition treatment is greater than or equal to 820° C. and less than or equal to 850° C.

In an embodiment, a thickness of the ultra-thin dielectric layer is greater than or equal to 1 nm and less than or equal to 2 nm. A thickness direction of the ultra-thin dielectric layer is consistent with a direction from the light receiving surface to the back surface; and/or a material of the ultra-thin dielectric layer includes one of silicon oxide, hafnium oxide, aluminum oxide, or silicon nitride.

BRIEF DESCRIPTION OF THE DRAWINGS

The accompanying drawings described herein are provided for further understanding of the present application and constitute a part of the present application. Exemplary embodiments of the present application and description thereof are used for explaining the present application, and do not constitute an inappropriate limitation to the present application. In the accompanying drawings.

REFERENCE NUMERALS

1—Semiconductor substrate, S1—Light receiving surface, S2—Back surface,
2—Ultra-thin dielectric layer, 3—Passivation layer, 30—Doped passivation layer,
4—First electrode, 5—Metallic crystal, 50—First metallic crystal,
51—Second metallic crystal, 52—Third metallic crystal, 60—Second lightly doped region,
61—Second heavily doped region, 62—First lightly doped region, 63—First heavily doped region,
64—Emitter, 70—First passivation/anti-reflection stacked structure,
71—Second passivation/anti-reflection stacked structure, 80—Second aluminum oxide passivation layer,
81—Second SiNx anti-reflection passivation layer, 82—First aluminum oxide passivation layer,
83—First SiNx anti-reflection passivation layer, 9—Second electrode.

DETAILED DESCRIPTION

To make the technical problems to be resolved by the present application, technical solutions, and beneficial effects more comprehensible, the following further describes the present application in detail with reference to the accompanying drawings and embodiments. It should be understood that specific embodiments described herein are merely used for explaining the present application rather than limiting the present application.

It should be noted that, when an element is referred to as "being fixed to"/"being arranged on" another element, the element may be directly on another element or indirectly on another element. When an element is referred to as "being connected to" another element, the element may be directly connected to another element or indirectly connected to another element.

In addition, the terms "first" and "second" are only used for a description purpose and cannot be understood as indicating or implying relative importance or implying a quantity of indicated technical features. Therefore, a feature defined by "first" or "second" can explicitly or implicitly include one or more of such features. In the description of the present application, unless otherwise specifically limited, "a plurality of" means two or more; and unless otherwise specifically limited, "at least one" means one or more.

In the description of the present application, it should be understood that, orientation or position relationships indicated by the terms such as "upper", "lower", "front", "rear", "left", and "right" are orientation or position relationships shown based on the accompanying drawings, and are only used for describing the present application conveniently and simplifying the description, but are not intended to indicate or imply that a mentioned apparatus or element needs to have a particular orientation or be constructed and operated in a particular orientation. Therefore, such terms cannot be understood as a limitation to the present application.

In the description of the present application, it should be noted that, unless otherwise explicitly specified and defined, the terms such as "mounted", "connected", and "connection" should be understood in a broad sense. For example, the connection may be a fixed connection, a detachable connection, or an integral connection; a mechanical connection or an electrical connection; or a direct connection, an indirect connection through an intermediate, or internal communication between two elements or an interaction relationship between two elements. A person of ordinary skill in the art may understand the specific meanings of the foregoing terms in the present application according to specific situations.

For a TOPCon cell in the related art, among various factors affecting improvement of the cell efficiency of the TOPCon cell, an important factor is that strong light parasitic absorption exists in a doped passivation layer of the cell. Specifically, a thick polycrystalline silicon layer is deposited at the doped passivation layer of the TOPCon cell, leading to long time required for carriers to pass through the passivation layer and severe light parasitic absorption. Further, a doping concentration of phosphorus atoms in the polycrystalline silicon layer of an N-type TOPCon cell ranges from 3*E20 to 6*E20 and the phosphorus atoms are uniformly doped, and the polycrystalline silicon layer doped with high-concentration phosphorus atoms generates a strong free carrier absorption phenomenon on light having a long band (that is, a wavelength ranging from 800 nm to 1200 nm), affecting the cell efficiency. In addition, in the structure of the TOPCon cell, electrodes are generated formed by sintering a silver-containing paste, and poor contact between the electrodes and the polycrystalline silicon layer leads to a decrease in a fill factor.

At present, in most researches, light parasitic absorption is reduced by reducing a thickness of the polycrystalline silicon layer to shorten time required for carriers to pass through the doped polycrystalline silicon layer or a low-concentration doped polycrystalline silicon layer, to achieve the objective of improving the cell efficiency. However, it is verified through experiments that although functions of reducing an ultraviolet light parasitic absorption effect and improving a photocurrent can be achieved by reducing the thickness of the polycrystalline silicon layer, an open circuit voltage loss is apparent. In addition, reducing the doping concentration of phosphorus in the polycrystalline silicon layer may lead to a weakened field passivation effect and deterioration of contact performance, resulting in a sharp decrease in the fill factor.

To resolve the foregoing technical problems, according to a first aspect, an embodiment of the present application provides a solar cell.

Figure 1:
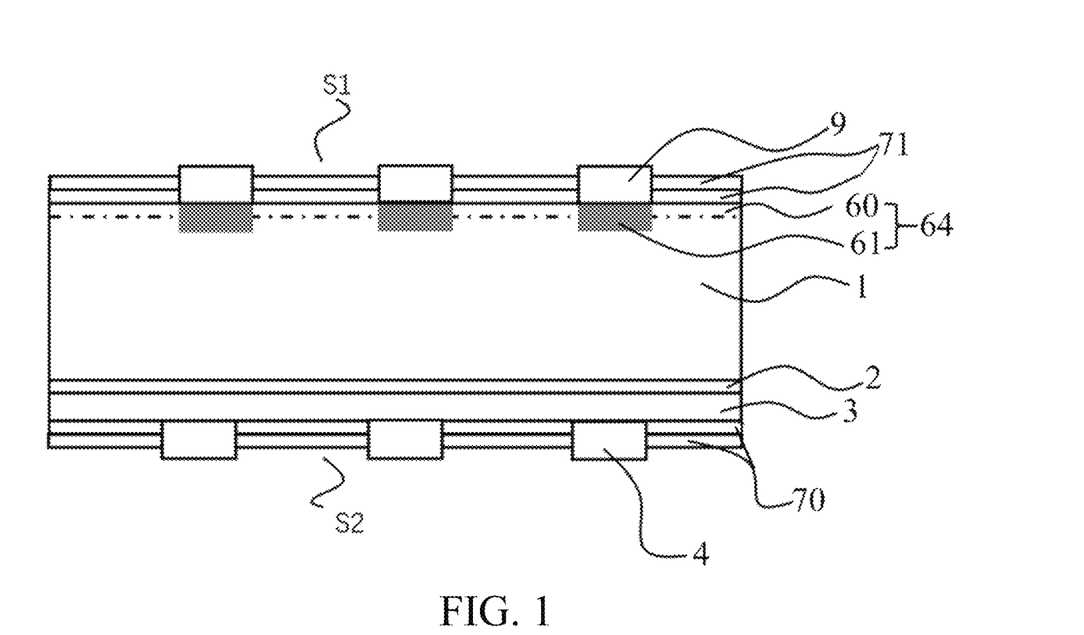
FIG. 1 is a first schematic structural diagram of a solar cell according to an embodiment of the present application.
Figure 2:
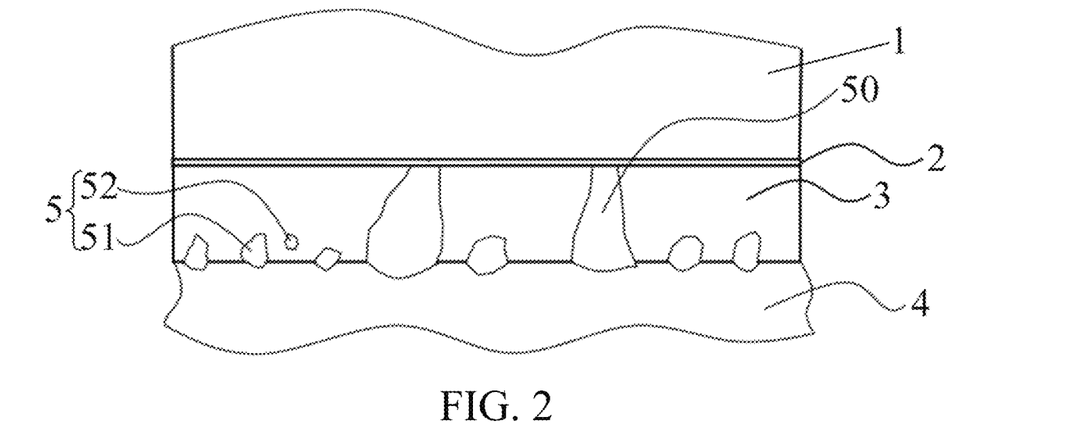
FIG. 2 is an enlarged view of a partial structure in FIG. 1 according to an embodiment of the present application.

Referring to FIG. 1 and FIG. 2, the solar cell includes: a semiconductor substrate 1, an ultra-thin dielectric layer 2, a passivation layer 3, a first electrode 4, and metallic crystals 5. The semiconductor substrate 1 has a light receiving surface S1 and a back surface S2 opposite to the light receiving surface, the ultra-thin dielectric layer 2 is formed on at least one of the back surface S2 and the light receiving surface S1 of the semiconductor substrate 1, the passivation layer 3 is formed on the ultra-thin dielectric layer 2, the first electrode 4 is formed on the passivation layer 3, and the metallic crystals 5 are formed in the passivation layer 3. The metallic crystals 5 include a first metallic crystal 50, where an end surface of the first metallic crystal 50 abuts against the ultra-thin dielectric layer 2, and another end surface of the first metallic crystal 50 is connected to the first electrode 4. It should be noted that, although in the embodiments shown in the present application, it is only shown that the passivation layer 3 is arranged on the ultra-thin dielectric layer 2 on the back surface S2, but it should be understood that a corresponding ultra-thin dielectric layer 2 and passivation layer 3 may also be arranged on the light receiving surface S1 of the semiconductor substrate 1.

The semiconductor substrate may be a silicon substrate, may be a monocrystalline silicon substrate in this embodiment, and may be a polycrystalline silicon substrate in other embodiments.

Optionally, the passivation layer 3 may be partially arranged on at least one of the back surface S2 and the light receiving surface S1. For example, the passivation layer 3 may be partially arranged on the back surface S2. Certainly, the passivation layer 3 may alternatively be partially arranged on the light receiving surface S1, or the passivation layer 3 may be partially arranged on both the back surface S2 and the light receiving surface S1. Optionally, the passivation layer 3 is arranged on the ultra-thin dielectric layer 2.

In an embodiment, the first electrode is made of a metal paste, and for example, mainly made by sintering a silver paste. Specifically, the metal paste is first printed to a specified position through means such as screen printing or laser transfer printing, and then sintered to form an electrode, so as to form excellent contact between the metal material and the passivation layer.

In an actual manufacturing process, the silver paste includes a silver metal composition, a glass material, and other additives and solvents. After a first electrode pattern is printed, an organic part in the silver paste is partially removed through drying, and the first electrode pattern is then sintered. A sintering temperature is greater than or equal to 700° C. and less than or equal to 800° C., and preferably, 740° C. After the sintering, most silver electrode materials are distributed on a surface of the passivation layer to form the first electrode.

A material of the metallic crystals may be selected according to an actual situation. For example, the material of the metallic crystals and the material of the first electrode may be the same, for example, silver.

In an embodiment, the solar cell is a tunnel oxide passivated contact solar cell. The following is described by using the tunnel oxide passivated contact solar cell as an example.

It should be understood that, the following description is only used for understanding and does not constitute a specific limitation. Referring to FIG. 1 and FIG. 2, compared with the related art, in the solar cell provided in the embodiments of the present application, on the basis of not thinning the passivation layer 3, the carrier transmission efficiency may be improved, an open circuit voltage loss may be reduced or eliminated, and excellent electrical contact performance between electrodes and the passivation layer may be ensured. Further, an end surface of the first metallic crystal 50 abuts against the ultra-thin dielectric layer 2, and another end surface of the first metallic crystal 50 is connected to the first electrode 4, to form a structure of metal-ultra-thin dielectric layer-semiconductor. In addition, the first metallic crystal 50 is located in the passivation layer 3, so that the first metallic crystal 50 is in full contact with the passivation layer 3. Based on this, a fill factor may be optimized by controlling a ratio of the first metallic crystal 50, thereby balancing an open circuit voltage and the fill factor. Furthermore, under an action of the first metallic crystal 50, movement of carriers to the first electrode 4 is facilitated, a carrier transmission rate is accelerated, and time required for the carriers to pass through the passivation layer 3 is further shortened. Based on this, the carrier transmission efficiency may be improved, and light parasitic absorption may be reduced, thereby ensuring the cell efficiency of the TOPCon cell.

In addition, the first metallic crystal 50 does not pass through the ultra-thin dielectric layer 2 and enter the semiconductor substrate 1. In this case, it may be ensured that the ultra-thin dielectric layer 2 is not damaged, thereby prevent functions of the ultra-thin dielectric layer 2 from being affected. That is, good chemical passivation and tunneling effects of the ultra-thin dielectric layer are ensured. In addition, influence on the open circuit voltage may be further reduced, to prevent the semiconductor substrate 1 from being damaged and prevent functions of the semiconductor substrate 1 from being affected, thereby ensuring the performance of the solar cell.

In conclusion, the first metallic crystal abuts against the ultra-thin dielectric layer without damaging a structure of the ultra-thin dielectric layer, so that good chemical passivation and tunneling effects of the ultra-thin dielectric layer are ensured. As a tunneling transmission layer of major carriers, the ultra-thin dielectric layer can transmit major carriers in the semiconductor substrate to pass through the ultra-thin dielectric layer. Next, the first metallic crystal plays a role in quickly transmitting major carriers passing through the ultra-thin dielectric layer to the first electrode, to ensure that a higher fill factor is obtained, and the transmission efficiency of major carriers in a good passivation structure can bring small contact resistivity and series resistance, thereby ensuring that higher cell efficiency is obtained.

In an embodiment, the passivation layer may have a polycrystalline structure, an amorphous structure, or a microcrystalline structure. In the embodiments of the present application, the passivation layer has a polycrystalline structure, and a crystallization rate of the passivation layer is 98% or higher. In addition, when the passivation layer is a polycrystalline silicon passivation layer, a thickness of the polycrystalline silicon passivation layer is greater than or equal to 45 nm and less than or equal to 200 nm, and a thickness direction of the polycrystalline silicon passivation layer is consistent with a direction from the back surface to the light receiving surface. For example, the thickness may be 45 nm, 50 nm, 80 nm, 100 nm, 120 nm, 150 nm, or 200 nm.

In an embodiment, a thickness of the ultra-thin dielectric layer 2 is greater than or equal to 1 nm and less than or equal to 2 nm. A thickness direction of the ultra-thin dielectric layer 2 is consistent with a direction from the light receiving surface S1 to the back surface S2. For example, the thickness of the ultra-thin dielectric layer is 1 nm, 1.2 nm, 1.5 nm, 1.7 nm, 1.85 nm, or 2 nm. A material of the ultra-thin dielectric layer 2 includes one of silicon oxide, hafnium oxide, aluminum oxide, or silicon nitride.

In the embodiments of the present application, the ultra-thin dielectric layer is a tunneling oxide layer.

In an embodiment, referring to FIG. 2, a ratio of a quantity of the first metallic crystal 50 to a total quantity of the metallic crystals 5 is greater than or equal to 2% and less than or equal to 20%. For example, the ratio may be 2%, 5%, 8%, 12%, 15%, 17%, 18%, or 20%. In this case, a tunneling-polycrystalline carrier tunneling effect may be prevented from being affected by an excessive quantity of the first metallic crystal.

Referring to FIG. 1 and FIG. 2, the reason why the first metallic crystal 50 does not burn through the ultra-thin dielectric layer 2 and enter the semiconductor substrate 1 may be that: the silver paste includes considerable quantities of metal silver and oxide glass material compositions (for example, lead oxide), and after the glass material compositions corrode the passivation/anti-reflection layer, the metal silver and the glass material enter the passivation layer 3. As sintering continues, the metal silver and its attached oxide enters an interface of a tunneling layer. Since the ultra-thin dielectric layer 2 is only a few nanometers in size and the silicon substrate is a dense monocrystalline structure, the metal silver cannot further pass through the tunneling layer and enter the silicon substrate. Alternatively, as an oxidization reaction may occur between the oxide of silver and an interface of the silicon substrate, a silicon oxide layer is formed between a silver crystal and the silicon substrate.

In an embodiment, referring to FIG. 2, the width of the first metallic crystal 50 gradually decreases along a direction from the first electrode 4 to the passivation layer 3.

In a case that the foregoing technical solution is used, the width of the first metallic crystal gradually decreases along the direction from the first electrode to the passivation layer, thereby reducing corrosion to the passivation layer and the semiconductor substrate, and reducing metal recombination between metal-ultra-thin dielectric layer interfaces. Further, the width of the first metallic crystal gradually increases along a direction from the passivation layer to the first electrode, so that a contact area between the first metallic crystal and the first electrode is increased, which is conducive to improving the transmission efficiency of major carriers transmitted by the first metallic crystal to the first electrode along a direction from the light receiving surface to the back surface.

For example, along the direction from the first electrode 4 to the passivation layer 3, the first metallic crystal 50 is approximately in a trapezoidal form.

In an embodiment, an end surface of the first metallic crystal 50 abuts against the ultra-thin dielectric layer 2, and another end surface of the first metallic crystal 50 is inserted into the first electrode 4, where a specific insertion size may be set according to an actual situation.

In an embodiment, referring to FIG. 2, the metallic crystals 5 further include a second metallic crystal 51. The second metallic crystal 51 is connected to the first electrode 4 and is spaced apart from the first metallic crystal 50. A thickness of the second metallic crystal 51 is less than a thickness of the passivation layer 3, and a thickness direction of the second metallic crystal 51 and a thickness direction of the passivation layer 3 are consistent with a direction from the back surface S2 to the light receiving surface S1. It should be understood that, an end surface of the second metallic crystal 51 may also be inserted into the first electrode 4, where an insertion size of the second metallic crystal 51 into the first electrode 4 and the thickness of the second metallic crystal 51 may be set according to an actual situation, which are not specifically limited herein.

In this case, movement of the carriers to the first electrode 4 is further facilitated, the carrier transmission rate is further accelerated, and time required for the carriers to pass through the passivation layer 3 is further shortened, thereby ensuring the cell efficiency of the TOPCon cell. In addition, contact resistance between the first electrode 4 and the passivation layer 3 may be further reduced. Further, since the thickness of the second metallic crystal 51 is less than the thickness of the passivation layer 3, the second metallic crystal 51 may be prevented from damaging the ultra-thin dielectric layer 2 and the semiconductor substrate 1, thereby ensuring the performance of the solar cell.

In an embodiment, referring to FIG. 2, the second metallic crystal 51 includes a plurality of second metallic crystals 51 distributed at intervals; and/or a ratio of a quantity of the plurality of second metallic crystals 51 to a total quantity of the metallic crystals is greater than or equal to 50% and less than or equal to 90%. For example, the ratio may be 50%, 58%, 62%, 75%, 82%, or 90%.

In a case that the foregoing technical solution is used, movement of the carriers to the first electrode is further facilitated, the carrier transmission rate is further accelerated, and time required for the carriers to pass through the passivation layer is further shortened, thereby ensuring the cell efficiency of the TOPCon cell. In addition, contact resistance between the first electrode and the passivation layer may be further reduced. Further, since the thickness of the second metallic crystal is less than the thickness of the passivation layer, the second metallic crystal may be prevented from damaging the ultra-thin dielectric layer and the semiconductor substrate, thereby ensuring the performance of the solar cell.

In an embodiment, referring to FIG. 2, the metallic crystals 5 further include a third metallic crystal 52. The third metallic crystal 52 is spaced apart from the first electrode 4, the ultra-thin dielectric layer 2, and the second metallic crystal 51. That is, the third metallic crystal 52 is neither connected to the first electrode 4 nor to the ultra-thin dielectric layer 2.

In this case, movement of the carriers to the first electrode 4 is further facilitated, the carrier transmission rate is further accelerated, and time required for the carriers to pass through the passivation layer 3 is further shortened, thereby ensuring the cell efficiency of the TOPCon cell. Further, since the third metallic crystal 52 is spaced apart from the ultra-thin dielectric layer 2, the third metallic crystal 52 may be prevented from damaging the ultra-thin dielectric layer 2 and the semiconductor substrate 1, thereby ensuring the performance of the solar cell.

In an embodiment, referring to FIG. 2, the third metallic crystal 52 includes a plurality of third metallic crystals 52 separately distributed in the passivation layer 3; and/or along a direction from the first electrode 4 to the passivation layer 3, a distance between the plurality of third metallic crystals 52 and the first electrode 4 is less than a distance between the plurality of third metallic crystals 52 and the ultra-thin dielectric layer 2. In the embodiments of the present application, the distance between the plurality of third metallic crystals 52 and the first electrode 4 is a half of the thickness of the passivation layer 3; and/or a ratio of a quantity of the second metallic crystal 51 to a total quantity of the metallic crystals is less than or equal to 5%.

In an embodiment, referring to FIG. 2, metallic crystals with small sizes are easily separated from the first electrode 4, but can hardly grow and extend toward a direction going deep into the passivation layer 3. Therefore, a ratio of an average volume of the plurality of third metallic crystals 52 to an average volume of the second metallic crystal 51 is less than or equal to 10%.

In a case that the foregoing technical solution is used, a third metallic crystal 52 with a small size is easily separated from the first electrode 4, and in an actual manufacturing process, the third metallic crystal is not expected to appear but inevitably appears during manufacturing. Therefore, the average volume and the quantity of the plurality of third metallic crystals need to be controlled to fall within the foregoing value ranges, to reduce influence generated by the third metallic crystal on the efficiency of the solar cell.

With reference to the foregoing description, compared with the second metallic crystal 51 and the third metallic crystal 52, the first metallic crystal 50 has the largest size. Further, the first metallic crystal 50, the second metallic crystal 51, and the third metallic crystal 52 are spaced apart from each other.

In an embodiment, referring to FIG. 1, the light receiving surface S1 of the solar cell has an emitter 64, which is obtained by having a doping type opposite to that of the semiconductor substrate 1. The emitter 64 may have a single doping region, or may have a selective emitter structure, that is, include a second lightly doped region 60 and a second heavily doped region 61 in contact with a second electrode 9 simultaneously. A doping concentration of the second heavily doped region 61 is greater than a doping concentration of the second lightly doped region 60.

In an embodiment, along a direction away from the semiconductor substrate, a first passivation/anti-reflection stacked structure 70 is formed on the passivation layer 3, and the first electrode 4 passes through the first passivation/anti-reflection stacked structure 70 to be connected to the passivation layer 3. Optionally, as shown in FIG. 1, a second passivation/anti-reflection stacked structure 71 is further formed on the light receiving surface S1 of the semiconductor substrate 1, and the second electrode 9 passes through the second passivation/anti-reflection stacked structure 71 to be connected to the second heavily doped region 61.

Figure 3:
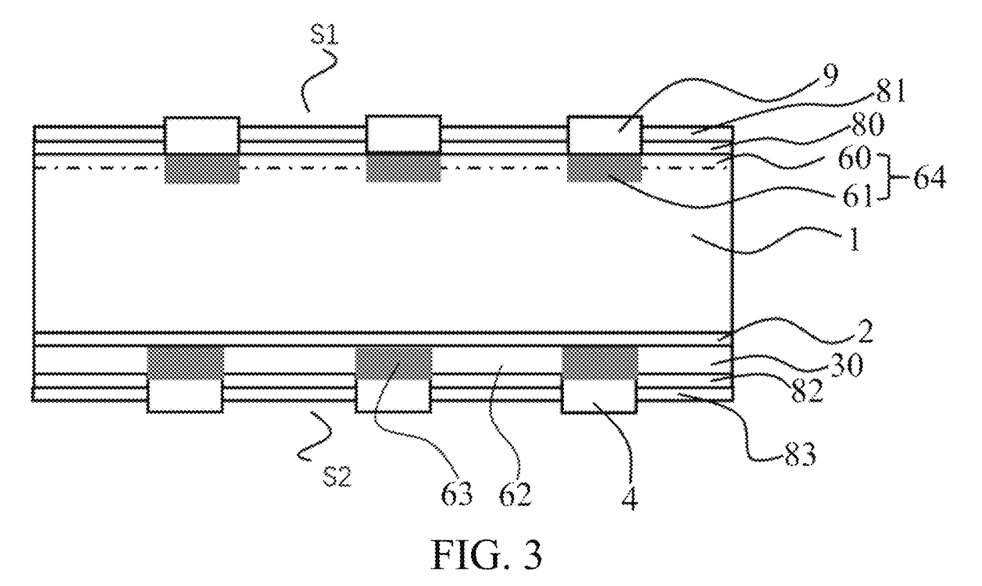
FIG. 3 is a second schematic structural diagram of a solar cell according to an embodiment of the present application.

In an embodiment, referring to FIG. 3, when the passivation layer is a doped passivation layer 30, the doped passivation layer 30 includes: a first heavily doped region 63 and a first lightly doped region 62. The first heavily doped region 63 is correspondingly connected to the first electrode 4. The first lightly doped region 62 is formed on a side of the first heavily doped region 63, and a doping concentration of the first heavily doped region 63 is greater than a doping concentration of the first lightly doped region 62.

The first heavily doped region 63 is correspondingly connected to the first electrode 4, so that good ohmic contact between the first electrode 4 and the doped passivation layer 30 may be ensured, thereby improving a fill factor. Further, the first lightly doped region 62 is not in contact with the first electrode 4, so that a non-metal contact region is formed, and the doping concentration of the first lightly doped region 62 is low. Therefore, this is conducive to reducing Auger recombination of the non-metal contact region and reducing parasitic absorption of the doped passivation layer to ultraviolet light.

For example, in an actual manufacturing process, low-concentration phosphorus diffusion (for example, a doping concentration ranges from 1E+20 to 3E+20) is performed on the passivation layer 3 to form a doped passivation layer 30. Local laser doping is then performed on a metallized region by using a laser device to form the first heavily doped region 63. A region outside the laser doping is a non-metallized region, that is, the first lightly doped region 62. In this case, problems caused by uniform doping in the polycrystalline silicon layer in the related art are resolved. In the embodiments of the present application, the passivation layer is doped with low-concentration phosphorus atoms, so that the strong free carrier absorption phenomenon of the doped passivation layer 30 on light having a long band (that is, a wavelength ranging from 800 nm to 1200 nm) in the related art is resolved, thereby improving the cell efficiency. Further, compared with the situations of a weakened field passivation effect and deterioration of contact performance caused by only reducing the doping concentration of phosphorus in the polycrystalline silicon layer in the related art, in the embodiments of the present application, the first heavily doped region and the first lightly doped region are formed. The first heavily doped region has a high doping concentration, so that a field passivation effect of the first heavily doped region is enhanced, and good contact exists between the doped passivation layer and the first electrode, thereby ensuring that the fill factor is not decreased. Light parasitic absorption of the first lightly doped region is reduced, so that a current gain is apparent.

In addition, in the related art, to ensure good ohmic contact between the doped passivation layer and the first electrode, generally, a printing line width of a silver paste for forming the first electrode 4 during screen printing is wide, leading to high unit consumption and high costs. However, in the embodiments of the present application, the first electrode 4 is connected to the first heavily doped region 63, so that good ohmic contact between the first electrode 4 and the doped passivation layer 30 is ensured. Therefore, the printing line width of the silver paste for forming the first electrode 4 may be appropriately narrowed to reduce manufacturing costs.

In addition, in the embodiments of the present application, the first heavily doped region and the first lightly doped region are formed. The first heavily doped region has a high doping concentration, so that good contact between the doped passivation layer and the first electrode is ensured. Therefore, the line width during screen printing may be appropriately narrowed. The first lightly doped region has a low doping concentration, so that light parasitic absorption is weak, and a current loss is reduced, which is conducive to improving the cell efficiency and reducing unit consumption of the metal paste.

In an embodiment, a thickness of the doped passivation layer is greater than or equal to 50 nm and less than or equal to 200 nm. For example, the thickness of the doped passivation layer may be 50 nm, 80 nm, 100 nm, 120 nm, 150 nm, 180 nm, or 200 nm. Compared with the related art, in the solar cell provided in the present application, on the basis of not reducing the thickness of the doped passivation layer, the carrier transmission efficiency may be improved, an open circuit voltage loss may be reduced or eliminated, and excellent electrical contact performance between electrodes and the passivation layer may be ensured.

In an embodiment referring to FIG. 3, a width of the first heavily doped region 63 is greater than a width of the first electrode 4. In the embodiments of the present application, the width of the first heavily doped region 63 is slightly greater than the width of the first electrode 4. In this case, subsequent screen alignment and printing are facilitated, to ensure the quality of the solar cell.

When the passivation layer is a doped passivation layer 30, the semiconductor substrate 1 may be an N-type crystalline silicon main body. A second aluminum oxide passivation layer 80 and a second SiNx anti-reflection passivation layer 81 are sequentially formed on the light receiving surface S1 of the semiconductor substrate 1, the light receiving surface S1 of the semiconductor substrate 1 includes a selective emitter, and the selective emitter includes a second lightly doped region 60 and a second heavily doped region 61 in contact with a second electrode 9. The second electrode 9 passes through the second SiNx anti- reflection passivation layer 81 and the second aluminum oxide passivation layer 80 to be connected to the second heavily doped region 61. A first aluminum oxide passivation layer 82 and a first SiNx anti-reflection passivation layer 83 are sequentially formed on the doped passivation layer 30, and the first electrode 4 passes through the first SiNx anti-reflection passivation layer 83 and the first aluminum oxide passivation layer 82 to be connected to the first heavily doped region 63.

It should be noted that, the passivation/anti-reflection stacked structure has the following functions: reflection of a surface of the solar cell to light may be reduced, so that more light can enter the solar cell and be absorbed by the solar cell, thereby improving the photoelectric conversion efficiency; erosion of an external environment to the surface of the solar cell is prevented, so that a service life of the solar cell is prolonged; a recombination loss of photogenerated carriers during transmission inside the solar cell may be reduced, so that the carrier collection efficiency is improved, thereby improving the photoelectric conversion efficiency of the cell; and the surface of the solar cell may be further protected, thereby preventing influence of surface defects on the performance of the solar cell.

According to a second aspect, an embodiment of the present application further provides a solar cell module. The solar cell module includes two or more solar cells electrically connected in series, each of the two or more solar cells being the solar cell described above; and a conductive wire, where the conductive wire is configured to electrically connect the two or more solar cells in series, and a projection of the conductive wire on a plane in which the passivation layer is located partially overlaps with a projection of the first electrode on the plane in which the passivation layer is located.

In a case that the foregoing technical solution is used, the conductive wire may be directly electrically connected to the first electrode, so that a connection point between the conductive wire and the first electrode is relatively small, and a welding stress is reduced. In addition, since electrical contact performance between the first electrode and the passivation layer is good, even if a welding contact surface between the conductive wire and the first electrode is small, a full electrical connection between the conductive wire and the solar cell can also be ensured, thereby ensuring the cell efficiency of the TOPCon cell.

Optionally, a welding joint structure may be arranged on the first electrode, and the conductive wire is electrically connected to the welding joint structure through welding, where a width of the welding joint structure is greater than the width of the first electrode in a direction perpendicular to an extending direction of the first electrode.

According to a third aspect, an embodiment of the present application further provides a method for manufacturing a solar cell. The method for manufacturing a solar cell includes the following operations:

Referring to FIG. 1 to FIG. 3, a semiconductor substrate 1 is first provided, where the semiconductor substrate 1 has a light receiving surface S1 and a back surface S2 opposite to the light receiving surface. For description of the semiconductor substrate, reference may be made to the first aspect, which is not specifically limited herein.

Texturing treatment is then performed on the semiconductor substrate 1.

For example, double-sided texturing is performed on an N-type raw silicon wafer by using a base and an additive.

Boron diffusion treatment is then performed on the semiconductor substrate 1 on which texturing is performed.

For example, a boron diffusion layer and a borosilicate glass (BSG) layer are formed on the light receiving surface S1 of the semiconductor substrate 1.

Local laser doping treatment is then performed on the boron diffusion layer and the BSG layer.

High-temperature oxidation treatment is then performed on a structure obtained through the laser doping treatment.

After the foregoing treatment is performed, a second heavily doped region 61 (corresponding to a region on which the laser doping treatment is performed) is formed on the light receiving surface S1 of the semiconductor substrate 1, and a part of the boron diffusion layer apart from the second heavily doped region 61 becomes a second lightly doped region 60.

The boron diffusion layer and the BSG layer on wound and expanded to the back surface S2 and a side surface of the semiconductor substrate 1 are then removed, and polishing treatment is performed on the back surface S2 of the semiconductor substrate 1 by using a NaOH or KOH alkali solution.

An ultra-thin dielectric layer 2 is then formed on at least one of the back surface S2 and the light receiving surface S1 of the semiconductor substrate 1.

In an embodiment, a thickness of the ultra-thin dielectric layer 2 is greater than or equal to 1 nm and less than or equal to 2 nm. A thickness direction of the ultra-thin dielectric layer 2 is consistent with a direction from the light receiving surface S1 to the back surface S2. For example, the thickness of the ultra-thin dielectric layer 2 is 1 nm, 1.4 nm, 1.6 nm, 1.9 nm, or 2 nm. A material of the ultra-thin dielectric layer 2 includes one of silicon oxide, hafnium oxide, aluminum oxide, or silicon nitride.

A passivation layer 3 is then formed on the ultra-thin dielectric layer 2.

In an embodiment, after the passivation layer 3 is formed on the ultra-thin dielectric layer 2, the method for manufacturing a solar cell further includes the following operations:

Doping diffusion treatment is performed on the passivation layer 3, to form a doped passivation layer 30.

For example, phosphorus doping is performed on the passivation layer 3 by using a low-voltage diffusion furnace, where a diffusion temperature in the doping diffusion treatment is greater than or equal to 800° C. and less than or equal to 830° C. For example, the diffusion temperature may be 800° C., 805° C., 810° C., 815° C., or 830° C. A junction pulling temperature is greater than or equal to 850° C. and less than or equal to 900° C. For example, the junction pulling temperature may be 850° C., 860° C., 880° C., 890° C., or 900° C.

Post-diffusion deposition treatment is then performed on the doped passivation layer 30, to form a second doping source layer on the doped passivation layer 30.

In an embodiment, a layer of phosphor silicate glass (PSG) layer is formed on the doped passivation layer 30. A diffusion temperature in the post-diffusion deposition treatment is greater than or equal to 820° C. and less than or equal to 850° C. For example, the diffusion temperature may be 820° C., 825° C., 830° C., 840° C., or 850° C.

Regional treatment is then performed on the second doping source layer by using a laser irradiation process, to form a first heavily doped region 63 in the doped passivation layer 30; and a part of the doped passivation layer 30 apart from the first heavily doped region 63 is a first lightly doped region 62.

For example, phosphorus atoms in the phosphorus-rich PSG layer are pushed into the doped passivation layer 30 by using laser, to form the first heavily doped region in the doped passivation layer 30.

The first heavily doped region 63 is correspondingly connected to the first electrode 4, and a doping concentration of the first heavily doped region 63 is greater than a doping concentration of the first lightly doped region 62.

In a case that the foregoing technical solution is used, the first heavily doped region 63 is correspondingly connected to the first electrode 4, so that good ohmic contact between the first electrode 4 and the doped passivation layer 30 may be ensured, thereby improving a fill factor. Further, the first lightly doped region 62 is not in contact with the first electrode 4, so that a non-metal contact region is formed, and the doping concentration of the first lightly doped region 62 is low. Therefore, this is conducive to reducing Auger recombination of the non-metal contact region and reducing parasitic absorption of the doped passivation layer to ultraviolet light.

The phosphorus diffusion layer and the PSG layer wound and expanded to the light receiving surface S1 and the side surface of the semiconductor substrate 1 are then removed, and the doped passivation layer 30 wound and plated on the light receiving surface S1, the BSG layer on the light receiving surface S1, and the PSG layer on the back surface S2 are then removed.

A first aluminum oxide passivation layer 82 is then formed on the doped passivation layer 30; a second aluminum oxide passivation layer 80 is formed on the light receiving surface S1 of the semiconductor substrate 1;
- a first SiNx anti-reflection passivation layer 83 is then formed on the first aluminum oxide passivation layer 82; a second SiNx anti-reflection passivation layer 81 is formed on the second aluminum oxide passivation layer 80; and
- a first electrode 4 and a second electrode 9 are then formed.

The first electrode 4 formed on the back surface S2 passes through the first SiNx anti-reflection passivation layer 83 and the first aluminum oxide passivation layer 82 to be connected to the first heavily doped region 63. The second electrode 9 formed on the light receiving surface S1 passes through the second SiNx anti-reflection passivation layer 81 and the second aluminum oxide passivation layer 80 to be connected to the second heavily doped region 61.

Metallic crystals are formed in the passivation layer 3, where the metallic crystals include a first metallic crystal 50, where an end surface of the first metallic crystal 50 abuts against the ultra-thin dielectric layer 2, and another end surface of the first metallic crystal 50 is connected to the first electrode 4.

Compared with the related art, in the method for manufacturing a solar cell provided in the embodiments of the present application, on the basis of not thinning the passivation layer 3, the carrier transmission efficiency may be improved, an open circuit voltage loss may be reduced or eliminated, and excellent electrical contact performance between electrodes and the passivation layer may be ensured. Further, an end surface of the first metallic crystal 50 abuts against the ultra-thin dielectric layer 2, and another end surface of the first metallic crystal 50 is connected to the first electrode 4, to form a structure of metal-ultra-thin dielectric layer-semiconductor. In addition, the first metallic crystal 50 is located in the passivation layer 3, so that the first metallic crystal 50 is in full contact with the passivation layer 3. Based on this, a fill factor may be optimized by controlling a ratio of the first metallic crystal 50, thereby balancing an open circuit voltage and the fill factor. Furthermore, under an action of the first metallic crystal 50, movement of carriers to the first electrode 4 is facilitated, a carrier transmission rate is accelerated, and time required for the carriers to pass through the passivation layer 3 is further shortened. In addition, the first metallic crystal 50 does not pass through the ultra-thin dielectric layer 2 and enter the semiconductor substrate 1. In this case, it may be ensured that the ultra-thin dielectric layer 2 is not damaged, thereby prevent functions of the ultra-thin dielectric layer 2 from being affected. That is, good chemical passivation and tunneling effects of the ultra-thin dielectric layer are ensured. In addition, influence on the open circuit voltage may be further reduced, to prevent the semiconductor substrate 1 from being damaged and prevent functions of the semiconductor substrate 1 from being affected, thereby ensuring the performance of the solar cell.

In conclusion, the first metallic crystal abuts against the ultra-thin dielectric layer without damaging a structure of the ultra-thin dielectric layer, so that good chemical passivation and tunneling effects of the ultra-thin dielectric layer are ensured. As a tunneling transmission layer of major carriers, the ultra-thin dielectric layer can transmit major carriers in the semiconductor substrate to pass through the ultra-thin dielectric layer. Next, the first metallic crystal plays a role in quickly transmitting major carriers passing through the ultra-thin dielectric layer to the first electrode, to ensure that a higher fill factor is obtained, and the transmission efficiency of major carriers in a good passivation structure on the back surface can bring small contact resistivity and series resistance, thereby ensuring that higher cell efficiency is obtained.

In an embodiment, a ratio of a quantity of the first metallic crystal to a total quantity of the metallic crystals is greater than or equal to 2% and less than or equal to 20%. For example, the ratio may be 2%, 5%, 8%, 12%, 15%, 17%, 18%, or 20%. In this case, a tunneling-polycrystalline carrier tunneling effect may be prevented from being affected by an excessive quantity of the first metallic crystal.

In an embodiment, referring to FIG. 2, the width of the first metallic crystal 50 gradually decreases along a direction from the first electrode 4 to the passivation layer 3.

In a case that the foregoing technical solution is used, the width of the first metallic crystal gradually decreases along the direction from the first electrode to the passivation layer, thereby reducing corrosion to the passivation layer and the semiconductor substrate, and reducing metal recombination between metal-ultra-thin dielectric layer interfaces. Further, the width of the first metallic crystal gradually increases along a direction from the passivation layer to the first electrode, so that a contact area between the first metallic crystal and the first electrode is increased, which is conducive to improving the transmission efficiency of major carriers transmitted by the first metallic crystal to the first electrode along a direction from the light receiving surface to the back surface.

For example, along the direction from the first electrode 4 to the passivation layer 3, the first metallic crystal 50 is approximately in a trapezoidal form.

In an embodiment, an end surface of the first metallic crystal 50 abuts against the ultra-thin dielectric layer 2, and another end surface of the first metallic crystal 50 is inserted into the first electrode 4, where a specific insertion size may be set according to an actual situation.

In an embodiment, referring to FIG. 2, the metallic crystals 5 further include a second metallic crystal 51. The second metallic crystal 51 is connected to the first electrode 4 and is spaced apart from the first metallic crystal 50. A thickness of the second metallic crystal 51 is less than a thickness of the passivation layer 3, and a thickness direction of the second metallic crystal 51 and a thickness direction of the passivation layer 3 are consistent with a direction from the back surface S2 to the light receiving surface S1. It should be understood that, an end surface of the second metallic crystal 51 may also be inserted into the first electrode 4, where an insertion size of the second metallic crystal 51 into the first electrode 4 and the thickness of the second metallic crystal 51 may be set according to an actual situation, which are not specifically limited herein.

In this case, movement of the carriers to the first electrode 4 is further facilitated, the carrier transmission rate is further accelerated, and time required for the carriers to pass through the passivation layer 3 is further shortened, thereby ensuring the cell efficiency of the TOPCon cell. In addition, contact resistance between the first electrode 4 and the passivation layer 3 may be further reduced. Further, since the thickness of the second metallic crystal 51 is less than the thickness of the passivation layer 3, the second metallic crystal 51 may be prevented from damaging the ultra-thin dielectric layer 2 and the semiconductor substrate 1, thereby ensuring the performance of the solar cell.

In an embodiment, the second metallic crystal includes a plurality of second metallic crystals distributed at intervals; and/or a ratio of a quantity of the plurality of second metallic crystals to a total quantity of the metallic crystals is greater than or equal to 50% and less than or equal to 90%. For example, the ratio may be 50%, 58%, 62%, 75%, 82%, or 90%.

In a case that the foregoing technical solution is used, movement of the carriers to the first electrode is further facilitated, the carrier transmission rate is further accelerated, and time required for the carriers to pass through the passivation layer is further shortened, thereby ensuring the cell efficiency of the TOPCon cell. In addition, contact resistance between the first electrode and the passivation layer may be further reduced. Further, since the thickness of the second metallic crystal is less than the thickness of the passivation layer, the second metallic crystal may be prevented from damaging the ultra-thin dielectric layer and the semiconductor substrate, thereby ensuring the performance of the solar cell.

In an embodiment, referring to FIG. 2, the metallic crystals 5 further include a third metallic crystal 52. The third metallic crystal 52 is spaced apart from the first electrode 4, the ultra-thin dielectric layer 2, and the second metallic crystal 51. That is, the third metallic crystal 52 is neither connected to the first electrode 4 nor to the ultra-thin dielectric layer 2.

In this case, movement of the carriers to the first electrode 4 is further facilitated, the carrier transmission rate is further accelerated, and time required for the carriers to pass through the passivation layer 3 is further shortened, thereby ensuring the cell efficiency of the TOPCon cell. Further, since the third metallic crystal 52 is spaced apart from the ultra-thin dielectric layer 2, the third metallic crystal 52 may be prevented from damaging the ultra-thin dielectric layer 2 and the semiconductor substrate 1, thereby ensuring the performance of the solar cell.

In an embodiment, referring to FIG. 2, the third metallic crystal 52 includes a plurality of third metallic crystals 52 separately distributed in the passivation layer 3; and/or along a direction from the first electrode 4 to the passivation layer 3, a distance between the plurality of third metallic crystals 52 and the first electrode 4 is less than a distance between the plurality of third metallic crystals 52 and the ultra-thin dielectric layer 2. In the embodiments of the present application, the distance between the plurality of third metallic crystals 52 and the first electrode 4 is a half of the thickness of the passivation layer 3; and/or a ratio of a quantity of the second metallic crystal 51 to a total quantity of the metallic crystals is less than or equal to 5%.

In an embodiment, referring to FIG. 2, metallic crystals with a small sizes are easily separated from the first electrode 4, but can hardly grow and extend toward a direction going deep into the passivation layer 3. Therefore, a ratio of an average volume of the plurality of third metallic crystals 52 to an average volume of the second metallic crystals 51 is less than or equal to 10%.

In a case that the foregoing technical solution is used, a third metallic crystal 52 with a small size is easily separated from the first electrode 4, and in an actual manufacturing process, the third metallic crystal is not expected to appear but inevitably appears during manufacturing. Therefore, the average volume and the quantity of the plurality of third metallic crystals need to be controlled to fall within the foregoing value ranges, to reduce influence generated by the third metallic crystal on the efficiency of the solar cell.

With reference to the foregoing description, compared with the second metallic crystal 51 and the third metallic crystal 52, the first metallic crystal 50 has the largest size. Further, the first metallic crystal 50, the second metallic crystal 51, and the third metallic crystal 52 are spaced apart from each other.

In the description of the foregoing embodiments, the specific features, structures, materials, or characteristics described may be combined in any one or more embodiments or examples in an appropriate manner.

The foregoing merely describes specific embodiments of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A solar cell, comprising:
   a semiconductor substrate, having a light receiving surface and a back surface opposite to the light receiving surface;
   a dielectric layer, formed on at least one of the back surface or the light receiving surface of the semiconductor substrate, wherein a thickness of the dielectric layer is less than or equal to a predetermined threshold;

a passivation layer, formed on the dielectric layer;
a first electrode, formed on the passivation layer; and
metallic crystals, formed in the passivation layer,
  wherein the metallic crystals comprise a plurality of first metallic crystals, wherein an end surface of a first metallic crystal of the plurality of first metallic crystals abuts against the dielectric layer, and another end surface of the first metallic crystal is connected to the first electrode, wherein a ratio of a quantity of the plurality of first metallic crystals to a quantity of the metallic crystals is greater than or equal to 2% and less than or equal to 20%.

2. The solar cell according to claim 1, wherein the passivation layer is partially arranged on at least one of the back surface or the light receiving surface.

3. The solar cell according to claim 1, wherein a width of the first metallic crystal decreases along a direction from the first electrode to the passivation layer.

4. The solar cell according to claim 1, wherein the metallic crystals further comprise a second metallic crystal, wherein the second metallic crystal is connected to the first electrode and spaced apart from the first metallic crystal,
  wherein a thickness of the second metallic crystal is less than a thickness of the passivation layer, wherein the thickness is measured along a direction from the back surface to the light receiving surface.

5. The solar cell according to claim 4, wherein the metallic crystals comprise a plurality of second metallic crystals distributed at intervals, and
  a ratio of a quantity of the plurality of second metallic crystals to a quantity of the metallic crystals is greater than or equal to 50% and less than or equal to 90%.

6. The solar cell according to claim 4, wherein the metallic crystals further comprises:
  a third metallic crystal, wherein the third metallic crystal is spaced apart from the first electrode, the dielectric layer, and the second metallic crystal.

7. The solar cell according to claim 6, wherein the metallic crystals comprise a plurality of third metallic crystals distributed in the passivation layer, and
  wherein along a direction from the first electrode to the passivation layer, a distance between the plurality of third metallic crystals and the first electrode is less than a distance between the plurality of third metallic crystals and the dielectric layer.

8. The solar cell according to claim 7, wherein the metallic crystals comprise a plurality of second metallic crystals distributed at intervals,
  wherein a ratio of a quantity of the plurality of second metallic crystals to a quantity of the metallic crystals is less than or equal to 5%, and
  wherein a ratio of an average volume of the plurality of third metallic crystals to an average volume of the plurality of second metallic crystals is less than or equal to 10%.

9. The solar cell according to claim 1, wherein the passivation layer is a doped passivation layer comprising:
  a first heavily doped region connected to the first electrode; and
  a first lightly doped region formed on a side of the first heavily doped region, wherein a doping concentration of the first heavily doped region is greater than a doping concentration of the first lightly doped region.

10. The solar cell according to claim 9, wherein a thickness of the doped passivation layer is greater than or equal to 50 nm and less than or equal to 200 nm.

11. The solar cell according to claim 1, wherein a thickness of the dielectric layer is greater than or equal to 1 nm and less than or equal to 2 nm, wherein the thickness is measured along a direction from the light receiving surface to the back surface, and
  wherein the dielectric layer comprises one of silicon oxide, hafnium oxide, aluminum oxide, or silicon nitride.

12. The solar cell of claim 1, wherein the predetermined threshold is 2 nm.

13. A solar cell module, comprising:
  two or more solar cells electrically connected in series, each of the two or more solar cells comprising:
    a semiconductor substrate, having a light receiving surface and a back surface opposite to the light receiving surface;
    a dielectric layer, formed on at least one of the back surface or the light receiving surface of the semiconductor substrate, wherein a thickness of the dielectric layer is less than or equal to a predetermined threshold;
    a passivation layer, formed on the dielectric layer;
    a first electrode, formed on the passivation layer; and
    metallic crystals, formed in the passivation layer, wherein the metallic crystals comprise a plurality of first metallic crystals, wherein an end surface of a first metallic crystal of the plurality of first metallic crystals abuts against the dielectric layer, and another end surface of the first metallic crystal is connected to the first electrode, and wherein a ratio of a quantity of the plurality of first metallic crystals to a quantity of the metallic crystals is greater than or equal to 2% and less than or equal to 20%; and
  a conductive wire configured to electrically connect the two or more solar cells in series, wherein a projection of the conductive wire on a plane in which the passivation layer is located partially overlaps with a projection of the first electrode on the plane in which the passivation layer is located.

14. A method for manufacturing a solar cell, comprising:
  providing a semiconductor substrate, wherein the semiconductor substrate has a light receiving surface and a back surface opposite to the light receiving surface;
  forming a dielectric layer on at least one of the back surface or the light receiving surface of the semiconductor substrate, wherein a thickness of the dielectric layer is less than or equal to a predetermined threshold;
  forming a passivation layer on dielectric layer;
  forming a first electrode on the passivation layer; and
  forming metallic crystals in the passivation layer,
  wherein the metallic crystals comprise a plurality of first metallic crystals, wherein an end surface of a first metallic crystal of the plurality of first metallic crystals abuts against the dielectric layer, and another end surface of the first metallic crystal is connected to the first electrode, and wherein a ratio of a quantity of the plurality of first metallic crystals to a quantity of the metallic crystals is greater than or equal to 2% and less than or equal to 20%.

15. The method according to claim 14, wherein a width of the first metallic crystal decreases along a direction from the first electrode to the passivation layer.

16. The method for manufacturing a solar cell according to claim 14, wherein after the forming the passivation layer on the dielectric layer, the method further comprises:
  performing doping diffusion treatment on the passivation layer to form a doped passivation layer;

performing post-diffusion deposition treatment on the doped passivation layer to form a second doping source layer on the doped passivation layer; and performing regional treatment on the second doping source layer by using a laser irradiation process, to form a first heavily doped region in the doped passivation layer, wherein a part of the doped passivation layer apart from the first heavily doped region is a first lightly doped region, wherein the first heavily doped region is connected to the first electrode, and a doping concentration of the first heavily doped region is greater than a doping concentration of the first lightly doped region.

17. The method according to claim 16, wherein:

a diffusion temperature of the doping diffusion treatment is greater than or equal to 800° C. and less than or equal to 830° C.; and a temperature of the post-diffusion deposition treatment is greater than or equal to 820° C. and less than or equal to 850° C.

* * * * *